United States Patent
Darbari et al.

(10) Patent No.: US 11,250,927 B2
(45) Date of Patent: *Feb. 15, 2022

(54) FORMAL VERIFICATION TOOL TO VERIFY HARDWARE DESIGN OF MEMORY UNIT

(71) Applicant: Imagination Technologies Limited, Kings Langley (GB)

(72) Inventors: Ashish Darbari, Abbots Langley (GB); Iain Singleton, Hemel Hempstead (GB)

(73) Assignee: Imagination Technologies Limited, Kings Langley (GB)

( * ) Notice: Subject to any disclaimer, the term of this patent is extended or adjusted under 35 U.S.C. 154(b) by 3 days.

This patent is subject to a terminal disclaimer.

(21) Appl. No.: 16/792,582

(22) Filed: Feb. 17, 2020

(65) Prior Publication Data
US 2020/0185051 A1    Jun. 11, 2020

Related U.S. Application Data

(63) Continuation of application No. 15/340,726, filed on Nov. 1, 2016, now Pat. No. 10,580,511.

(30) Foreign Application Priority Data

Nov. 11, 2015  (GB) .................................... 1519890

(51) Int. Cl.
*G11C 29/00*   (2006.01)
*G11C 29/38*   (2006.01)
(Continued)

(52) U.S. Cl.
CPC .......... *G11C 29/38* (2013.01); *G06F 11/2221* (2013.01); *G06F 11/3037* (2013.01);
(Continued)

(58) Field of Classification Search
CPC ............. G06F 11/2221; G06F 11/3037; G06F 11/3409; G11C 29/56; G11C 29/48;
(Continued)

(56) References Cited

U.S. PATENT DOCUMENTS

| | | | | |
|---|---|---|---|---|
| 5,267,206 A | * | 11/1993 | Koyabu | G11C 29/48 365/201 |
| 5,557,619 A | * | 9/1996 | Rapoport | G11C 29/14 714/718 |
| 5,604,756 A | * | 2/1997 | Kawata | G11C 29/56 714/773 |

(Continued)

FOREIGN PATENT DOCUMENTS

| | | |
|---|---|---|
| GB | 2527165 A | 12/2015 |
| JP | 01292550 A | 11/1989 |

(Continued)

*Primary Examiner* — Esaw T Abraham
*Assistant Examiner* — Osman M Alshack
(74) *Attorney, Agent, or Firm* — Potomac Law Group, PLLC; Vincent M DeLuca

(57) ABSTRACT

Hardware monitors which can be used by a formal verification tool to exhaustively verify a hardware design for a memory unit. The hardware monitors include detection logic to monitor one or more control signals and/or data signals of an instantiation of the memory unit to detect symbolic writes and symbolic reads. In some examples a symbolic write is a write of symbolic data to a symbolic address; and in other examples a symbolic write is a write of any data to a symbolic address. A symbolic read is a read of the symbolic address. The hardware monitors also include assertion verification logic that verifies an assertion that read data corresponding to a symbolic reads matches write data associated with one or more symbolic writes preceding the read.

20 Claims, 11 Drawing Sheets

(51) Int. Cl.
*G06F 11/22* (2006.01)
*G06F 11/30* (2006.01)
*G06F 11/34* (2006.01)
*G11C 29/12* (2006.01)
*G11C 29/44* (2006.01)
*G11C 29/04* (2006.01)

(52) U.S. Cl.
CPC ...... *G06F 11/3409* (2013.01); *G11C 29/1201* (2013.01); *G11C 29/44* (2013.01); *G11C 2029/0409* (2013.01)

(58) Field of Classification Search
CPC ......... G11C 29/44; G11C 29/50; G11C 29/14; G11C 29/1201; G11C 29/38; G11C 2029/0409; G11C 29/10
USPC .......................................... 714/718, 719, 763
See application file for complete search history.

(56) References Cited

U.S. PATENT DOCUMENTS

| | | | | |
|---|---|---|---|---|
| 5,646,948 A * | 7/1997 | Kobayashi | ............. | G11C 29/56 714/719 |
| 6,505,313 B1 | 1/2003 | Phan et al. | | |
| 6,523,135 B1 * | 2/2003 | Nakamura | ............. | G11C 29/10 714/30 |
| 7,913,126 B2 * | 3/2011 | Nakagawa | ............. | G11C 29/24 714/710 |
| 10,331,831 B2 | 6/2019 | Darbari et al. | | |
| 2003/0163777 A1 * | 8/2003 | Holt | ................... | G06F 11/1004 714/763 |
| 2006/0190788 A1 * | 8/2006 | Jasinski | ................. | G11C 29/56 714/733 |
| 2008/0104556 A1 * | 5/2008 | Yamada | .................. | G06F 30/33 716/102 |
| 2009/0172529 A1 * | 7/2009 | Jas | .......................... | G06F 30/33 715/700 |
| 2010/0211836 A1 * | 8/2010 | Kodama | ................. | G06F 11/27 714/721 |
| 2010/0257322 A1 * | 10/2010 | Isherwood | .......... | G06F 12/0815 711/141 |
| 2010/0269016 A1 * | 10/2010 | Ware | .................... | G11C 11/5621 714/763 |
| 2013/0223168 A1 * | 8/2013 | Taylor | .................... | G11C 29/16 365/194 |
| 2014/0245062 A1 * | 8/2014 | Cooper | ............... | G06F 11/1092 714/6.22 |
| 2015/0278416 A1 * | 10/2015 | Darbari | ............... | G06F 30/3312 716/108 |
| 2016/0188429 A1 * | 6/2016 | Noguchi | ............. | G11C 11/1675 714/6.21 |

FOREIGN PATENT DOCUMENTS

| | | |
|---|---|---|
| JP | 2007249293 A | 9/2007 |
| JP | 2015069549 A | 4/2015 |
| WO | 88/09554 A1 | 12/1988 |

* cited by examiner

FORMAL VERIFICATION TOOL TO VERIFY HARDWARE DESIGN OF MEMORY UNIT

CROSS-REFERENCE TO RELATED APPLICATIONS AND CLAIM OF PRIORITY

This application is a continuation under 35 U.S.C. 120 of copending application Ser. No. 15/340,726 filed Nov. 1, 2016, which claims foreign priority under 35 U.S.C. 119 from United Kingdom Application No. 1519890.6 filed Nov. 11, 2015.

BACKGROUND

Memory units, such as random access memory (RAM), are common components in computer systems (e.g. processors). Accordingly, verifying the operation of memory units in a hardware design is an important task. However, different memory units can support or implement one or more optional features, such as, multiple access ports, partial reads/writes, clock gating, and pipelining; which makes it difficult to design a generic system and/or method to verify the operation of memory units.

The embodiments described below are provided by way of example only and are not limiting of implementations which solve any or all of the disadvantages of known memory unit verification systems.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Described herein are hardware monitors which can be used by a formal verification tool to exhaustively verify a hardware design for a memory unit. The hardware monitors include detection logic to monitor one or more control signals and/or data signals of an instantiation of the memory unit to detect symbolic writes and symbolic reads. In some examples a symbolic write is a write of symbolic data to a symbolic address; and in other examples a symbolic write is a write of any data to a symbolic address. A symbolic read is a read of the symbolic address. The hardware monitors also include assertion verification logic that verifies an assertion that read data corresponding to a symbolic read matches write data associated with one or more symbolic writes preceding the read.

A first aspect provides a hardware monitor configured to verify operation of an instantiation of a memory unit defined in a hardware design, the hardware monitor comprising: detection logic configured to monitor one or more control signals of an instantiation of the memory unit to detect writes to a symbolic address of the instantiation of the memory unit and reads of the symbolic address of the instantiation of the memory unit; and assertion verification logic configured to verify an assertion that establishes that when the detection logic detects a read of the symbolic address that occurs after one or more writes to the symbolic address, read data corresponding to the read of the symbolic address matches write data corresponding to the one or more writes to the symbolic address.

A second aspect provides a test system configured to verify a hardware design for a memory unit, the test system comprising: the hardware monitor of the first aspect; and a formal verification tool configured to use the hardware monitor to verify the assertion is true for the hardware design for a plurality of symbolic address values.

A third aspect provides a method of verifying operation of an instantiation of a memory unit defined in a hardware design, the method comprising: monitoring, using detection logic, one or more control signals of the instantiation of the memory unit to detect writes to a symbolic address of the instantiation of the memory unit; monitoring, using detection logic, one or more control signals of the instantiation of the memory unit to detect reads of the symbolic address of the instantiation of the memory unit; and verifying operation of the instantiation of the memory unit, using assertion verification logic, by verifying an assertion that establishes that when a read of the symbolic address occurs after one or more writes to the symbolic address, read data corresponding to the read of the symbolic address matches write data corresponding to the one or more writes to the symbolic address.

A fourth aspect provides computer readable code adapted to perform the steps of the method of the third aspect when the code is run on a computer.

A fifth aspect provides a computer readable storage medium having encoded thereon the computer readable code of the fourth aspect.

A sixth aspect provides a method of manufacturing, at an integrated circuit manufacturing system, a hardware monitor of the first aspect.

A seventh aspect provides an integrated circuit definition dataset that, when processed in an integrated circuit manufacturing system, configures the system to manufacture a hardware monitor of the first aspect.

An eighth aspect provides a computer readable storage medium having stored thereon an integrated circuit definition dataset that, when processed in an integrated circuit manufacturing system, configures the system to manufacture a hardware monitor of the first aspect.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
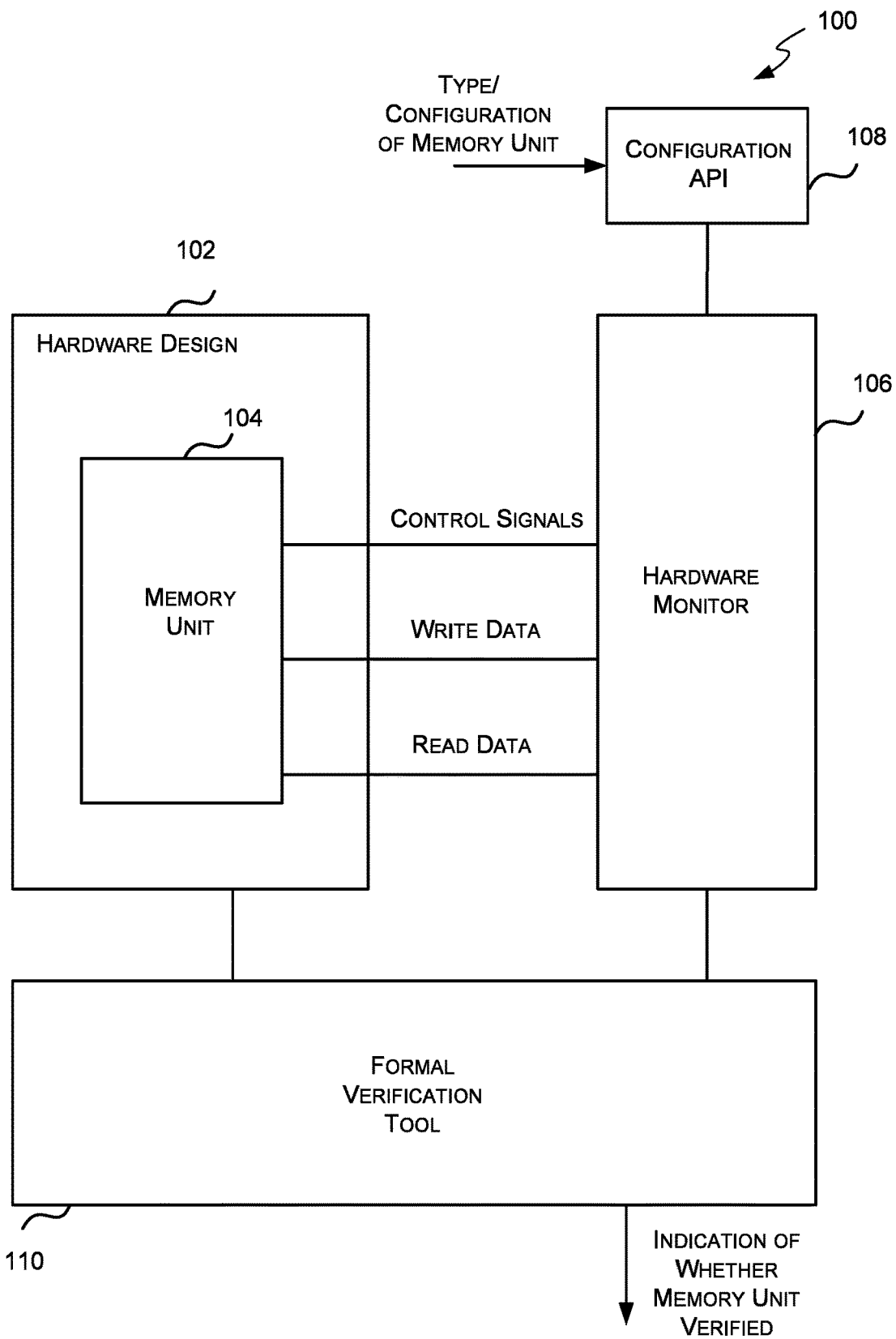
FIG. 1 is a block diagram of an example test system for verifying a hardware design for a memory unit using a hardware monitor.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Described herein are hardware monitors which can be used by a formal verification tool to formally verify a hardware design for a memory unit (e.g. RAM (random access memory) or CAM (content addressable memory)). The memory unit may implement one or more of the following features: partial read and write of data; pipelined reads; clock gating; multiple access ports; and read buffers. The hardware monitors are configured to monitor one or more control signals and/or data signals of an instantiation of the memory unit to detect symbolic writes and symbolic reads. In some examples a symbolic write is a write of symbolic data to a symbolic address; and in other examples a symbolic write is a write of any data to a symbolic address. A symbolic read is a read of the symbolic address. When the hardware monitor detects a symbolic read the hardware monitor determines, using an assertion, whether the instantiation of the memory unit is operating as expecting by comparing the read data corresponding to the symbolic read to write data associated with one or more preceding symbolic writes. A formal verification tool can use the hardware monitor to determine that for all possible values of the symbolic variable(s) (e.g. symbolic address and/or symbolic data) that the assertion holds for the hardware design and thus an instantiation of the memory unit will operate as expected.

The hardware monitors described herein can be used to exhaustively verify the operation of instantiations of a variety of different types of memory units with different features using only a few registers to trap or record key read and write events and relate those events using a single assertion. Accordingly the hardware monitors described herein are reusable, fast, scalable, and efficient; and can be used to provide exhaustive verification of hardware designs for memory units. The hardware monitors described herein also make it possible to identify corner-case bugs or errors in the hardware design for a memory unit, which if not impossible, would be extremely difficult to identify using any other method.

Reference is first made to FIG. 1 which shows a block diagram of an example test system 100 in which the hardware monitors described herein may be used to verify hardware designs for memory units. The test system 100 comprises a hardware design 102 that defines one or more memory units 104; a hardware monitor 106; a configuration API (application program interface) 108 and a formal verification tool 110.

The term "hardware design" is used herein to refer to a description of an integrated circuit for all or part of an electronic system (e.g. a processor) which can be used to generate a hardware manifestation of the integrated circuit (e.g. the hardware design may be synthesized into silicon or used to program a field-programmable gate array (FPGA)). The hardware design may relate to a module, block, unit, sub-system, system or any combination thereof of the electronic system (e.g. processor).

A hardware design may be implemented in a high level hardware description language (HDL), such as, but not limited to, a register transfer language (RTL). Examples of register transfer languages include, but are not limited to, VHDL (VHSIC Hardware Description Language) and Verilog. It will be evident to a person of skill in the art that other high level languages may be used such as proprietary high level languages.

An "instantiation of the hardware design" refers to a representation of the hardware defined by the hardware design. An instantiation of the hardware design embodies the hardware design in a form which can be tested to verify the hardware design. An instantiation of a hardware design includes, but is not limited to, a synthesized version of the hardware design, a hardware implementation of the hardware design (e.g. an integrated circuit made according to the hardware design), and a mathematical model (e.g. a state-transition system) generated by a formal verification tool.

The hardware design 102 of FIG. 1 defines or describes one or more memory units 104 where each memory unit 104 is a hardware component or set of components which may be used to store data. The term "memory unit" is intended to include RAM units such as static RAM (SRAM) units and dynamic RAM (DRAM) units; register file units; content addressable memory (CAM) units; read only memory (ROM) units; and any other similar hardware units for storing data.

Each memory unit 104 may implement none, one or more than one of the following features: the memory unit may allow partial reads and writes; the memory unit may be single-ported; the memory unit may be multi-ported; the memory unit may be pipelined; the memory unit may be non-pipelined; the memory unit may implement clock gating; and the memory unit may not implement clock gating.

A memory unit 104 is typically divided into blocks of addressable memory where each block of memory can be used to store one or more bits of data. The number of bits per memory block is referred to herein as the data width. A memory unit allows partial reads and writes if it allows some of the bits of a block to be written to (or read) at a time and not others. For example, if each block is a byte comprising eight bits then a memory unit allows partial reads and writes if it allows less than eight bits of the block to be written to or read from in any cycle. In some cases the bits of a memory block are partitioned or divided into groups of bits called a partition and the memory unit only allows reads or writes to a partition. For example, if each block is divided into partitions of two bits (i.e. it has a partition size of two) then the memory block or memory can only be written to or read from in sets of two bits.

A memory unit is single-ported if it only has a single access port that allows only one memory access (i.e. a memory read or a memory write) in a cycle (e.g. clock cycle). A memory unit is multi-ported if it has multiple access ports that allow multiple memory accesses in the same cycle (e.g. clock cycle). The simplest case of a multi-ported memory unit is a memory unit that has a single read port and a single write port to allow a memory read and a memory write in the same cycle. However, a multi-ported memory unit may have any combination of write ports, read ports, and read/write ports to allow multiple memory accesses in the same cycle.

Memory units are typically controlled by one or more clocks. As is known to those of skill in art the components (e.g. registers) that are driven by the same clock are said to belong to the same clock domain. Where different components of a memory unit (e.g. different memory blocks) are driven by different clocks then the memory unit is said to have multiple clock domains.

Some memory units may use a clock-gating scheme to gate (e.g., turn off) the clock(s) provided to the memory unit in order to conserve power. Where there are multiple clocks, all or only some of the clocks may be clock gated. Also, the whole memory unit or only some of the memory blocks may be clock gated.

Memory units may also be flow-through or pipelines. Flow-through memory units allow data access without latency. In other words data from a read is returned or output in the same cycle (e.g. clock cycle) the read instruction is issued to the memory unit. However, reading the memory unit and returning the read value in the same cycle results in a lower operating frequency and thus reduced bandwidth. A pipelined memory unit increases the bandwidth by performing reads in multiple steps. For example, in a first cycle the read instruction may be issued to the memory unit. In a second cycle the read data is pushed to a register and output. Accordingly, there is a one cycle latency to read data. Many memory units implement such a one cycle pipeline in which the read data is output in the cycle after a read request was made. However, other memory units may include further pipeline stages (e.g. registers) to improve bandwidth. In these memory units the read data is output at least two cycles after the read request was made. Some pipelined memory units are configured to hold the read data in a register until a read data clock signal is generated.

Accordingly, some pipelined memory units may have a fixed delay between when a read request is issued and when the corresponding read data is output (e.g. based on the number of pipeline stages). Other pipelined units, however, may have a variable delay between when a read request is issued and when the corresponding read data is output (e.g. the read data may only be output when a read data clock signal is generated).

The exemplary hardware design 102 of FIG. 1 defines one memory unit 104, but it will be evident to a person of skill in the art that the methods and principles described herein can be equally applied to hardware designs that define more than one memory unit.

The hardware monitor 106 is a module, which may be implemented in a formal verification language, that is configured to monitor one or more control signals, and/or one or more data signals (e.g. write data and read data signals) of an instantiation of the memory unit 104 to verify that if data is written to a particular address of the instantiation of the memory unit, a subsequent read of the same address will read/output the same data.

The hardware monitor 106 is configured to monitor one or more control signals and/or the write data signal to detect when there is a "symbolic write". In some cases a "symbolic write" is a write of any data to a symbolic address. In other cases a "symbolic write" is a write of symbolic data to a symbolic address. The term "symbolic" is used herein to mean a variable that does not have a predetermined or fixed value, but is assigned a value during verification. The formal tool 110 (which is described in more detail below) is configured to evaluate every possible value of a symbolic value, as specified by any constraints. For example, where a symbolic write is a write of symbolic data to a symbolic address then the formal tool 110 evaluates each possible value for the symbolic address and each possible value for the symbolic data.

The term "control signal" is used herein to mean any signal that is transmitted to, or from, the memory unit that controls writing of data to, or reading data from, an instantiation of the memory unit. Example control signals, include, but are not limited to, a clock signal, a chip enable signal, a write enable signal, a read enable signal, a clock gating enable signal, an address signal, a write address signal and a read address signal. The term "control signal" does not include the data signals (e.g. write data signal and read data signal) that comprise the data written to, or read from, the memory unit.

If the hardware monitor 106 detects a symbolic read it compares the corresponding read data to the write data corresponding to one or more preceding symbolic write via an assertion. If the read data does not match the write data then an error has occurred.

As is known to those of skill in the art an assertion is a statement that a particular property is expected to hold for a hardware design (i.e. is always true). An assertion of the form "assert property [evaluable expression]" is said to "assert" the property specified by the "evaluable expression". If an asserted property (e.g. the evaluable expression) is evaluated to be false for an instantiation of the hardware design at any point in time the instantiation of the hardware design is not behaving as expected and there is an error in the hardware design. For example, in the example assertion "assert property a=b"; if a is not equal to b then the instantiation of the hardware design is not behaving as expected and there is an error in the hardware design.

Assertions are used to capture required temporal behavior of the hardware design in a formal and unambiguous way. The hardware design can then be verified to determine that it conforms to the requirement as captured by the assertion(s). Since assertions capture the design behavior on a cycle-by-cycle basis they can be used to verify intermediate behaviors.

In the hardware monitor 106 described herein the property that is asserted is that if a read of the symbolic address follows one or more writes to the symbolic address then the read data matches the data written. Example assertions which may be used by the hardware monitor 106 will be described below. If the asserted property is not true then the instantiation of the memory unit 104 is not behaving as expected.

The assertion is typically expressed in an assertion language. An assertion language, which may also be referred to as a property language captures the design behavior spread across multiple design cycles in a concise, unambiguous manner. While traditional high level description languages (HDL), such as RTL, have the ability to capture individual cycle behavior, they are too detailed to describe properties at a higher level. In particular, assertion languages provide means to express temporal relationships and complex design behaviors in a concise manner. Assertion languages include, but are not limited to, System Verilog (SV), Property Specification Language (PSL), Incisive Assertion Library (IAL), Synopsys OVA (OpenVera Assertions), Symbolic Trajectory Evaluation (STE), SystemC Verification (SCV), 0-In, Specman, and OpenVera Library (OVL).

Example implementations of the hardware monitor 106 are described below with reference to FIGS. 2 to 9.

Since different memory units 104 may use different control signals and/or implement or support one or more of the features described above (e.g. multi-port; pipeline; clock-gating; partial read/writes; read buffers) the specific control signals and the status thereof that indicate a certain state or event (e.g. a write or a read) may vary based on the type of memory unit 104 and/or the configuration thereof. Accordingly, the hardware monitor 106 may comprise logic blocks for certain types of memory and certain features that can be enabled or disabled. The configuration API 108 is a software module that is configured to receive information on the type of memory unit and/or the configuration thereof and to configure the hardware monitor 106 (e.g. enable and/or disable certain logic blocks) to verify the operation of an instantiation of that particular memory unit. In some cases the configuration API 108 may determine the type of memory unit and configuration thereof (e.g. which features are implemented) from the hardware design (e.g. RTL).

The configuration API 108 allows a single hardware monitor 106 to be used to verify the operation of instantiations of different types and/or configurations of memory units 104.

Once the hardware monitor 106 has been configured by the configuration API 108 for the specific memory unit 104 being verified, the hardware monitor 106 is bound to the corresponding input and output ports of the hardware design 102. In particular, the hardware monitor 106 is bound to the appropriate control signal(s) and write and read data signals of the hardware design 102. For example, where the hardware monitor 106 is implemented in SV and the hardware design 102 is implemented in RTL, the SV code is bound to the RTL code.

The hardware design 102 (e.g. RTL), hardware monitor 106 (e.g. SV) and bindings are loaded into a formal verification tool 110. The formal verification tool 110 is a software tool that is capable of performing formal verification of a hardware design. Formal verification is a systematic process that uses mathematical reasoning to verify a property in a hardware design. Formal verification can be contrasted to simulation-based verification in which a hardware design is verified by applying stimuli to an instantiation of the hardware design and monitoring the output of the instantiation of the hardware design in response to the stimuli.

In formal verification, the hardware design 102 is transformed into a mathematical model (e.g. a state-transition system) to thereby provide an instantiation of the hardware design which can be tested to verify the hardware design, and the asserted properties are expressed using mathematical logic using a precise syntax or a language with a precise mathematical syntax and semantics.

A property is verified by searching the entire reachable state space of an instantiation of the hardware design without explicitly traversing the state machine. The search is done by, for example, encoding the states using efficient Boolean encodings using Binary decision diagrams (BDDS), or using advanced SAT (satisfiability-based bounded model checking) based techniques. In some cases tools can be used to implement techniques, such as, but not limited to, abstraction, symmetry, symbolic indexing, and invariants to improve performance and achieve scalability.

Since formal verification algorithmically and exhaustively explores all input values over time, verifying properties in this manner allows a property to be exhaustively proved or disproved for all states.

The formal verification tool 110 may then output an indication of whether the hardware design 102 has been verified (i.e. an instantiation of the hardware design behaves as expected). The output may be yes the hardware design 102 has been verified; no the hardware design 102 has not been verified; or the formal verification was inconclusive. The formal verification may be inconclusive, for example, because the computing-based device running the formal verification tool 110 has run out of memory or because the formal verification tool 110 has determined that a certain amount of progress has not been made after a predefined period of time. In some cases, where the hardware design was not verified (e.g. the assertion failed), the formal verification tool 110 may also output information indicating when and/or where the assertion failed to aide designers in correcting the hardware design.

Accordingly, in the test system 100 of FIG. 1 the formal verification tool 110 evaluates the property asserted in the hardware monitor 106 for all possible values of the symbolic variable(s) (e.g. symbolic address) to determine if there is a state of an instantiation of the hardware design 102 in which the property is not true.

Once the verification is complete the hardware design 102 may be modified based on the outcome of the verification (e.g. the information output by the formal verification tool 110). For example, if the verification identifies that the hardware design was not verified then the hardware design may be modified to correct the behavior. The modified hardware design may then be re-verified and once verified the modified hardware design may be implemented in hardware to generate an integrated circuit as described with reference to FIG. 11.

Although the hardware monitor 106 has been shown in FIG. 1 as a verification component which is used by a formal verification tool 110 to formally verify the hardware design 102 for a memory unit 104, it will be evident to a person of skill in the art that the hardware monitors 106 described herein may be used as a design component or a verification component. Where the hardware monitor 106 is used as a design component the hardware monitor 106 may be ultimately synthesized into hardware (e.g. an integrated circuit) and used as a monitor during operation of a hardware implementation (e.g. integrated circuit) of a memory unit to which it is bound. Where the hardware monitor 106 is used as a verification component it may be implemented in software and used to verify a hardware design 102 for a memory unit 104 through formal verification (as described above) or through simulation-based verification where input stimuli are applied to an instantiation of the hardware design 102 being verified.

Figure 2:
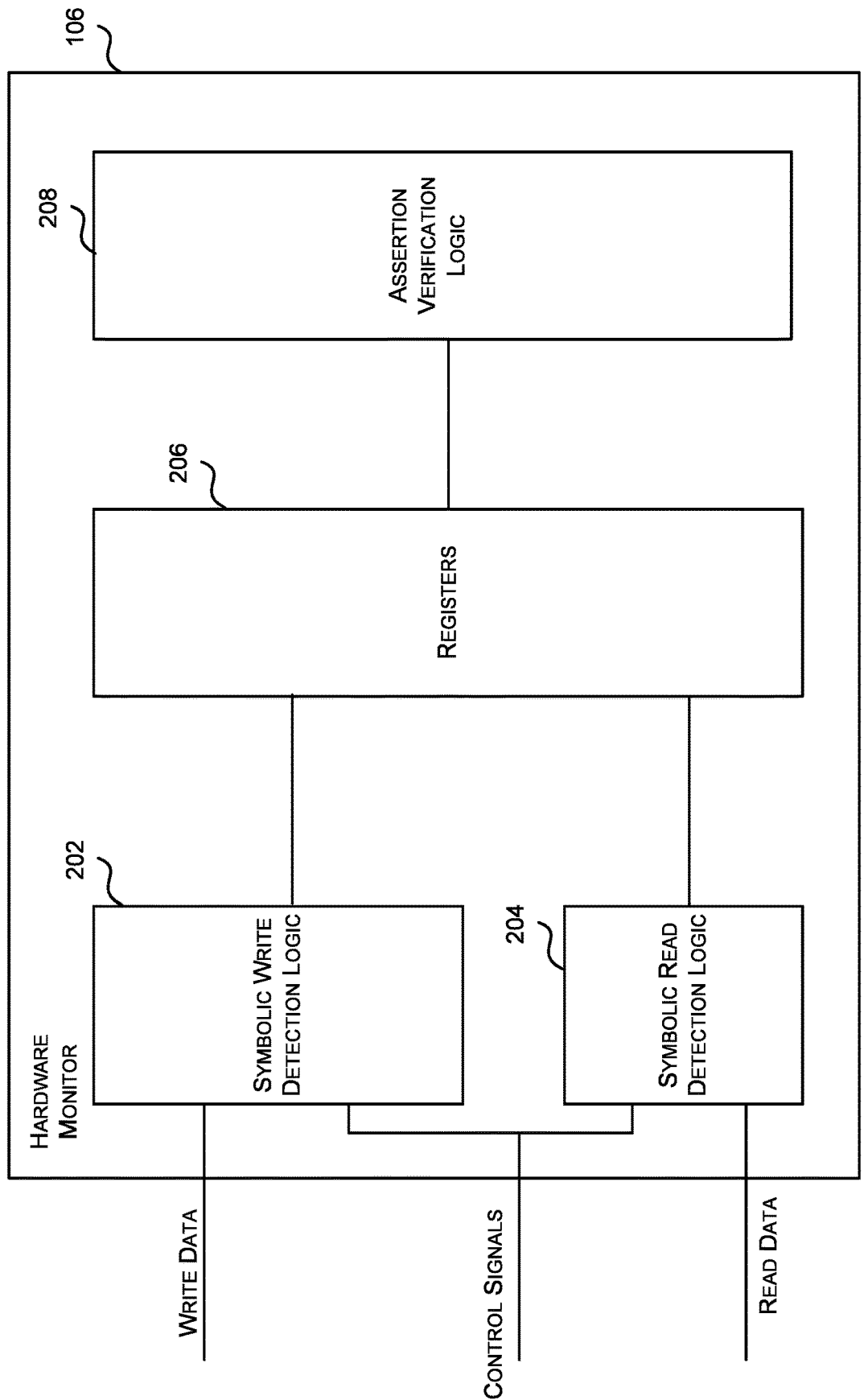
FIG. 2 is a block diagram of an example implementation of the hardware monitor of FIG. 1.

Reference is now made to FIG. 2 which illustrates a block diagram of an example implementation of the hardware monitor 106 of FIG. 1. In this example implementation the hardware monitor 106 includes symbolic write detection logic 202 for monitoring one or more control signals and/or write data signal of an instantiation of the memory unit 104 to detect symbolic writes; symbolic read detection logic 204 for monitoring one or more control signals to detect symbolic reads; a set of registers 206 for recording read and write events detected by the detection logic 202 and 204; and assertion verification logic 208 for determining whether the instantiation of the memory unit 104 is operating as expected by evaluating an assertion that the read data corresponding to a symbolic read that occurs after a symbolic write matches the write data.

The symbolic write detection logic 202 monitors one or more control signals and/or the write data signal to detect symbolic writes. As described above, in some cases a symbolic write is a write of any data to a symbolic address. In these cases the symbolic write detection logic 202 may be configured to detect a symbolic write when the one or more control signals indicate a write to the symbolic address. In other cases a symbolic write is a write of symbolic data to the symbolic address. In these cases the symbolic write detection logic 202 may be configured to detect a symbolic write when the one or more control signals indicate a write to the symbolic address and the write data (indicated by the write data signal) is equal to the symbolic data. If the symbolic write detection logic 202 detects a symbolic write then the symbolic write detection logic 202 updates the set of registers 206 with information on the detected symbolic write.

The symbolic read detection logic 204 is configured to monitor one or more control signals to detect reads of the symbolic address. If the symbolic read detection logic 204 detects a read of the symbolic address then the symbolic read detection logic 204 updates the set of registers 206 with the information on the detected symbolic read.

The set of registers 206 are used to store information related to read and write events detected by the detection logic 202 and 204. For example, in some cases the set of registers 206 may comprise a seen symbolic write register which is set when the symbolic write detection logic 202 detects a symbolic write; and a symbolic read request register which is set when the symbolic read detection logic 204 detects a symbolic read after a symbolic write. Example registers which may form the set of registers 206 will be described below with reference to FIGS. 4, 8 and 9.

The assertion verification logic 208 verifies an assertion that the read data corresponding to a symbolic read following one or more symbolic writes matches the data written by the one or more symbolic writes. In particular the assertion verification logic 208 monitors the registers 206 to determine when a symbolic read has been made after one or more symbolic writes. When the assertion verification logic 208 detects a symbolic read after a symbolic write it compares the read data to the data written to the symbolic address by the one or more symbolic writes to determine whether they match. If the read data matches the data written to the symbolic address then the instantiation of the memory unit is operating as expected. If, however, the read data does not match the data written to the symbolic address then the instantiation of the memory unit is not operating as expected indicating an error in the configuration of the memory unit (i.e. an error in the hardware design 102).

In the example implementation of the hardware monitor shown in FIG. 2 the symbolic write detection logic 202, the symbolic read detection logic 204, and the assertion verification logic 208 are shown as different logic blocks however in other cases they may be implemented by a single logic block or another combination of logic blocks.

The example implementation of the hardware monitor 106 shown in FIG. 2 allows only a few registers to be used to trap the read and write events which are related using a single assertion. Accordingly the hardware monitor can be implemented with relatively low complexity.

The operation of the hardware monitor of FIG. 2 will be described with reference to FIG. 3.

Figure 3:
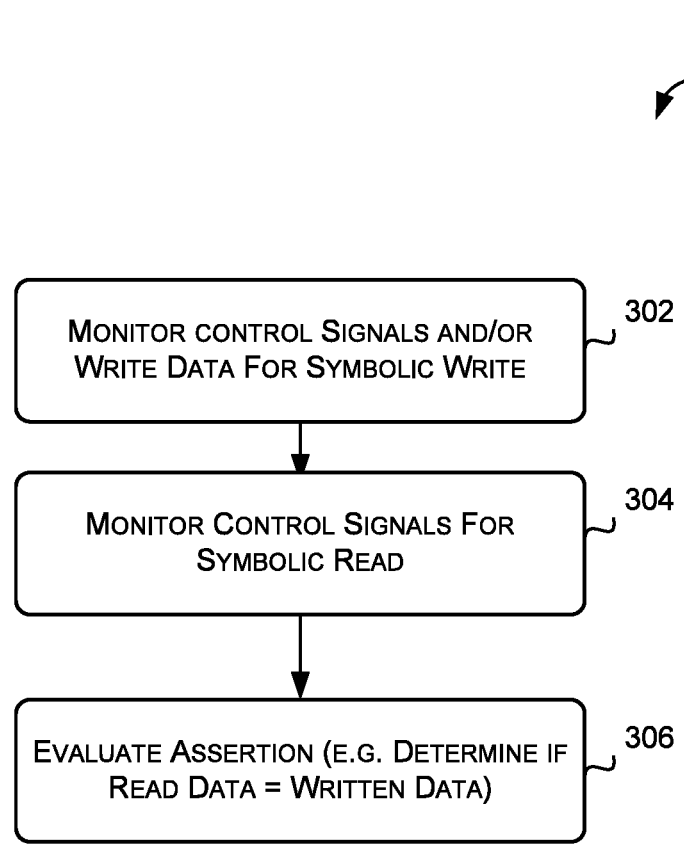
FIG. 3 is a flow diagram of an example method for verifying operation of an instantiation of a memory unit defined in a hardware design using the hardware monitor of FIG. 2.

Reference is now made to FIG. 3 which illustrates an example method 300 for verifying the operation of an instantiation of the memory unit which may be implemented by the hardware monitor 106 of FIG. 2. The method 300 begins at block 302 where the symbolic write detection logic 202 monitors one or more control signals and/or the write data signal to detect a symbolic write. An example method for implementing block 302 will be described with reference to FIG. 5. Once a symbolic write has been detected the method 300 proceeds to block 304 where the symbolic read detection logic 204 monitors one or more control signals to detect a symbolic read. An example method for implementing block 304 will be described with reference to FIG. 6. Once a symbolic read has been detected after a symbolic write the method 300 proceeds to block 306 where the assertion verification logic 208 compares the read data associated with the symbolic read to the write data associated with the symbolic write to determine if they match. If they match then the instantiation of the memory unit is operating as expected. If, however, they do not match then there is an error. An example method for implementing block 306 is described with reference to FIG. 7.

Figure 4:
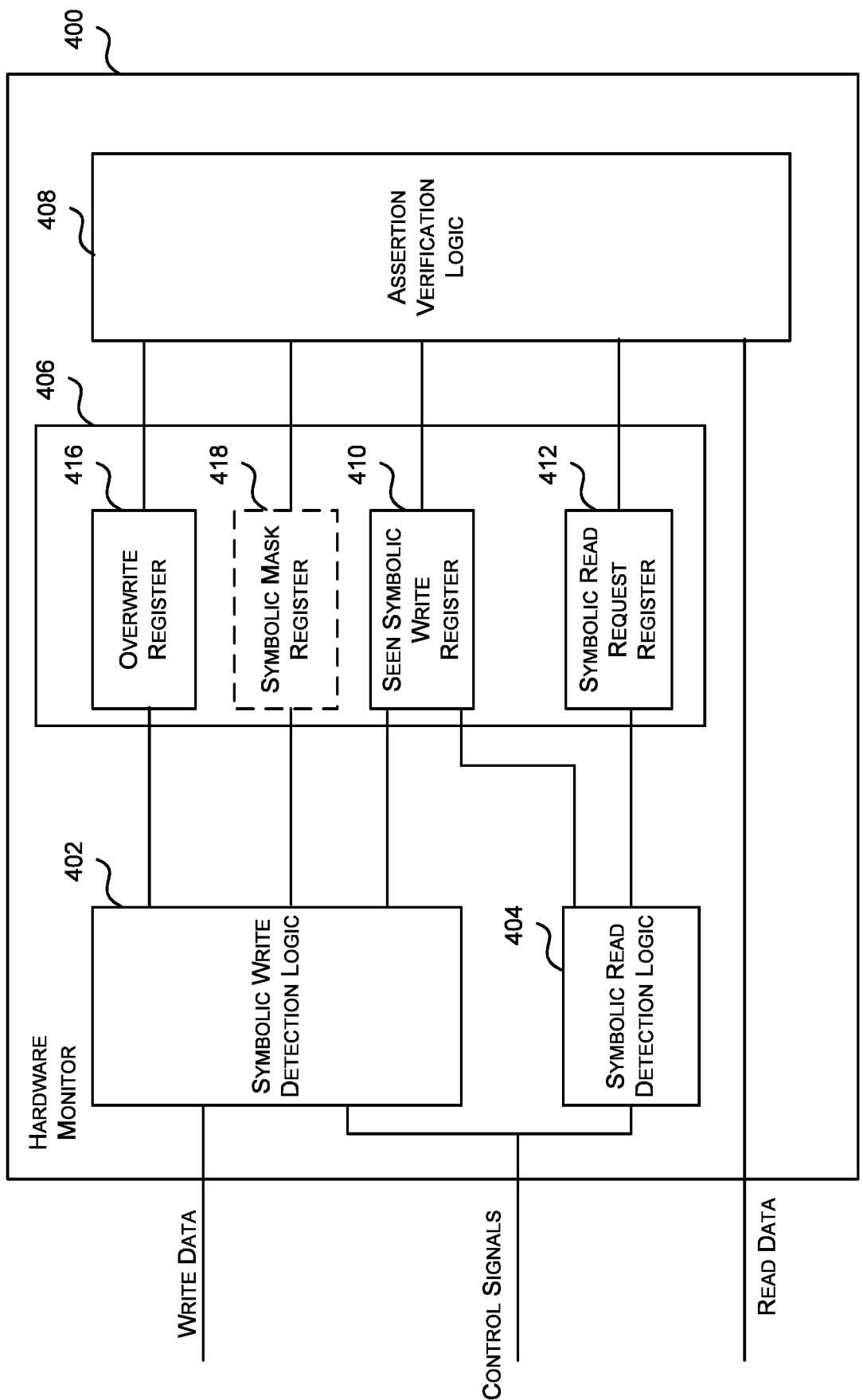
FIG. 4 is a block diagram of a first example implementation of the hardware monitor of FIG. 2 with a first set of registers.

Reference is now made to FIG. 4 which illustrates a first example implementation of a hardware monitor 400 which uses a first set of registers 406. In this example a symbolic write is considered to be a write of symbolic data to the symbolic address, and an instantiation of the memory unit is considered to be operating as expected if the read data associated with a symbolic read following a symbolic write is equal to or matches the symbolic data.

The hardware monitor 400 comprises symbolic write detection logic 402, symbolic read detection logic 404, a set of registers 406 and assertion verification logic 408. In this example the set of registers 406 comprises a seen symbolic write register 410 for indicating when a symbolic write has been detected, a symbolic read request register 412 for indicating when a symbolic read has been detected after a symbolic write, and an overwrite register 416 for indicating when a write to the symbolic address has happened after the symbolic write. The set of registers 406 may also optionally include a symbolic mask register 418 for indicating which bits at the symbolic address were written to by the symbolic write (in cases where the instantiation of the memory unit allows partial reads and writes).

The symbolic write detection logic 402 is configured to monitor one or more control signals and the write data signal for writes of the symbolic data to the symbolic address. If the symbolic write detection logic 402 detects a write of the symbolic data to the symbolic address the symbolic write detection logic 402 sets the seen symbolic write register 410 to indicate that a symbolic write event has been detected. In some cases, where the instantiation of the memory unit being verified allows partial reads and writes, the symbolic write detection logic 402 may also be configured to record, in for example the symbolic mask register 418, which bits of the symbolic address were written to during the symbolic write. If the symbolic write detection logic 402 detects a write to the symbolic address after a symbolic write has been detected (e.g. when the seen symbolic write register 410 is set) then the symbolic write detection logic 402 may be configured to set the overwrite register 416 to indicate that the data at the symbolic address has been overwritten.

The symbolic read detection logic 404 is configured to monitor one or more control signals for reads of the symbolic address. If the symbolic read detection logic 404 detects a read of the symbolic address after a symbolic write (e.g. when the seen symbolic write register 410 is set) then the symbolic read detection logic 404 sets the symbolic read request register 412 to indicate a symbolic read has been detected after a symbolic write.

The assertion verification logic 408 verifies an assertion that the read data for a symbolic read following a symbolic write matches the symbolic data. In this example implementation the assertion verification logic 408 determines that a symbolic read has been made after a symbolic write if the seen symbolic write register 410 and the symbolic read request register 412 are set and the overwrite register 416 is not set. If the assertion verification logic 408 determines that a symbolic read has been made after a symbolic write then the assertion verification logic 408 compares the read data to the symbolic data. In particular, the assertion verification logic 408 may obtain the read data from the read data signal and compare it to the symbolic data.

Where the instantiation of the memory unit allows partial reads and writes, the assertion verification logic 408 may be configured to combine (e.g. perform an AND operation on) the read data and the symbolic data with the data in the symbolic mask register 418 before comparing the read data with the symbolic data so only those bits written to by the symbolic write are compared.

Figure 5:
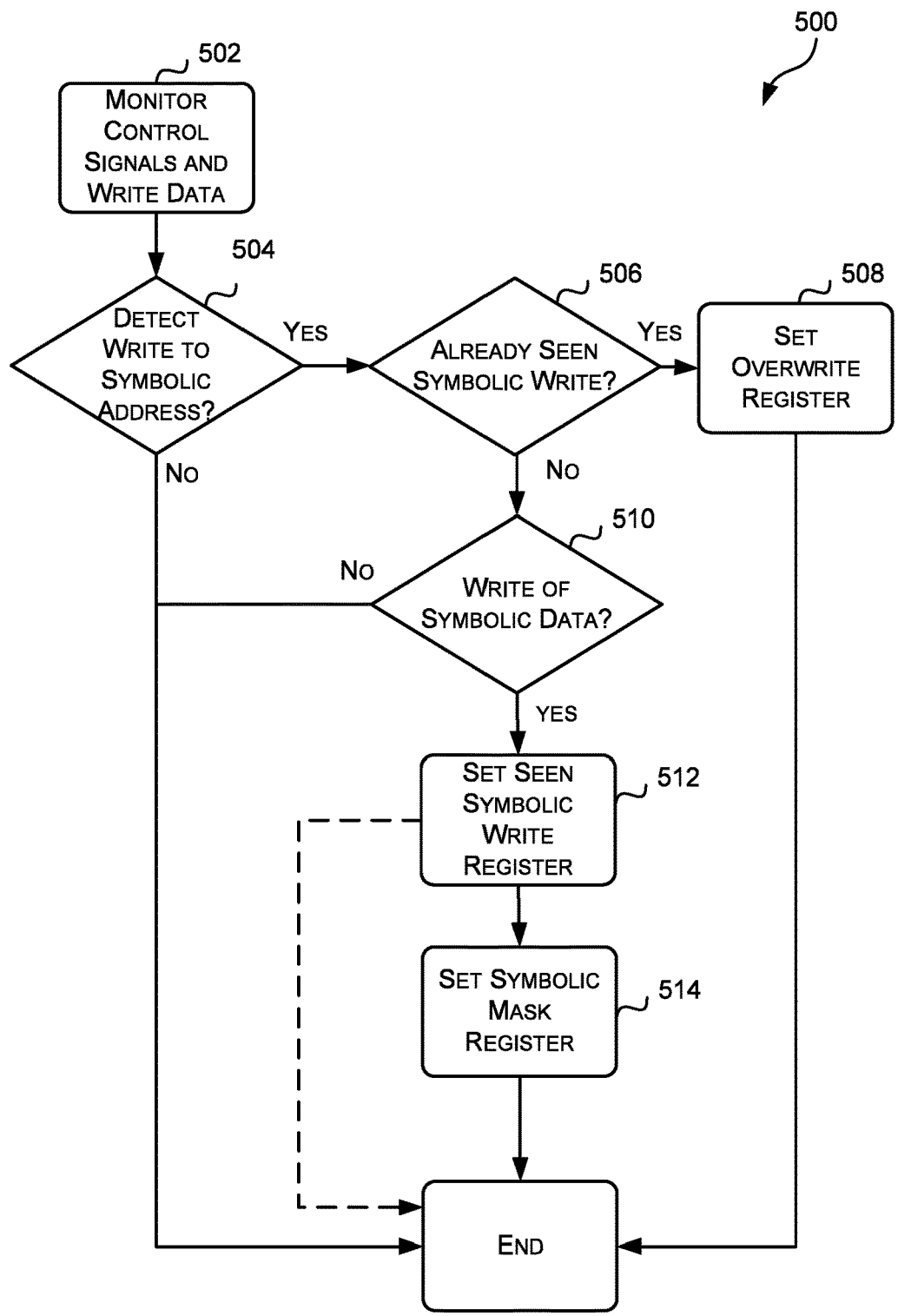
FIG. 5 is a flow diagram of an example method for detecting a symbolic write to an instantiation of a memory unit using the hardware monitor of FIG. 4.

Reference is now made to FIG. 5 which illustrates an example method 500 for detecting a symbolic write to the memory unit which may be implemented by the symbolic write detection logic 402 each cycle. The method 500 begins at block 502 where the symbolic write detection logic 402 monitors one or more control signals and the write data signal of an instantiation of the memory unit. In some cases monitoring the one or more control signals and write data signal may comprise sampling the relevant control signals and write data signal. As described above, the relevant control signals for identifying a symbolic write may be determined based on the type of memory unit being verified and the configuration thereof. Example control signals which may be monitored to detect a symbolic write include, but are not limited to, a chip enable signal (c_en), a write enable signal (wr_en), an address signal (addr), and a write address signal (wr_addr). The method 500 then proceeds to block 504.

At block 504, the symbolic write detection logic 402 determines whether the one or more control signals indicate a write to the symbolic address. In some cases determining whether the one or more control signals indicate a write to the symbolic address comprises determining if the one or more control signals indicate a write; and determining whether the write address matches the symbolic address. The specific control signals and the status thereof that may be used to indicate a write may be based on the type of memory unit being verified and the configuration thereof.

For example, if the memory unit being verified is, for example, a single port RAM that uses a chip enable signal (c_en) to enable reads and writes, a write enable signal (wr_en) to indicate a write to the RAM, and an address signal (addr) to specify the read address or the write address, the symbolic write detection logic 402 may be configured by the configuration API 108 to detect a write when the chip enable signal (c_en) is low and the write enable signal (wr_en) is low; and to detect a write to the symbolic address when a write is detected and the address specified by the address signal (addr) matches the symbolic address.

In another example, if the memory unit being verified is, for example, a dual port RAM that uses a write enable signal (wr_en) to indicate a write to the RAM, a read enable signal (rd_en) to indicate a read of the RAM, a write address signal (wr_addr) to specify the write address, and a read address signal (rd_addr) to specify the read address, the symbolic write detection logic 402 may be configured by the configuration API 108 to detect a write when the write enable signal (wr_en) is low; and to detect a write to the symbolic address when a write is detected and the address specified by the write address signal (wr_addr) matches the symbolic address.

It will be evident to a person of skill in the art that these are examples only and that other controls signals and/or combinations thereof may be used to detect a write to the symbolic address.

If the symbolic write detection logic 402 does not detect a write to the symbolic address then the method 500 ends. If, however, the symbolic write detection logic 402 detects a write to the symbolic address the method 500 proceeds to block 506.

At block 506, the symbolic write detection logic 402 determines whether a symbolic write has already been detected. In some cases the symbolic write detection logic 402 determines whether a symbolic write has already been detected based on the status of the seen symbolic write register 410. For example, the symbolic write detection logic 402 may determine that a symbolic write has already been detected if the seen symbolic write register 410 is set. If the symbolic write detection logic 402 determines a symbolic write has already been detected then the method 500 proceeds to block 508 where the overwrite register 416 is set to indicate that the symbolic write has been overwritten and then the method 500 ends. If, however, the symbolic write detection logic 402 determines that a symbolic write has not already been detected then the method 500 proceeds to block 510.

At block 510, the symbolic write detection logic 402 determines whether the write to the symbolic address is a symbolic write (i.e. whether the symbolic data is written to the symbolic address). The symbolic write detection logic 402 may determine whether the write to the symbolic address writes the symbolic data by comparing the write data (e.g. from the write data signal (wr_data)) to the symbolic data to determine if they match. If the symbolic write detection logic 402 determines that the write is not a symbolic write (i.e. the symbolic data is not written to the symbolic address) then the method 500 ends. If, however, the symbolic write detection logic 402 determines that the write is a symbolic write then the method 500 proceeds to block 512.

At block 512, the symbolic write detection logic 402 sets the seen symbolic write register 410 to indicate that a symbolic write has been detected. For example, in some cases the symbolic write detection logic 402 may be configured to set the seen symbolic write register 410 to "1" to indicate that a symbolic write had been detected. The method 500 may then proceed to block 514 (e.g. if the memory unit being verified allows partial reads and writes) or it may end.

At block 514, the symbolic write detection logic 402 determines which bits at the symbolic address are written to and stores a record of which bits are written to in the symbolic mask register 418. In particular, memory units that allow partial writes and reads allow only some of the bits at a particular address to be written to in a cycle. The bits that are written to may be identified from the control signals. For example, in some cases there is a write enable signal per partition and the bits that are written to may be identified based on the status of the write enable signals. In some cases the symbolic write detection logic 402 stores a string of bits in the symbolic mask register 418 where each bit indicates whether the corresponding memory bit was written to. For example if a memory block has four bits numbered from zero to three where the least significant bit is 0, then a symbolic mask of [0 0 1 1] may indicate that bits zero and one were written to, but that bits two and three were not written to.

The following is example SV code which may be implemented by the symbolic write detection logic 402 to set the symbolic mask register 418 if the memory unit being verified is, for example, a single port RAM that uses a chip enable signal (c_en) to enable reads and writes, a write enable signal (wr_en) to indicate a write to the RAM, and an address signal (addr) to specify the read address or the write address. In the example below symb_mask represents the symbolic mask register 418, data_symb represents the symbolic data, symb_addr represents the symbolic address, write indicates whether or not a write was detected, w is the data width, and p is the partition size.

```
// -- Set each bit of the masked data individually if that bit is
being written, thus creating a mask of size w
always @(*) begin
    k = 0;
    for (i=0;i<(w/p);i=i+1) begin
        for (j=0;j<p;j=j+1) begin
            masked_data[k] = !wr_en[i];
            k        = k + 1;
        end
    end
end
// -- In the cycle where the watched data is being written to the
watched location, if the mask has not already been set then
    // -- transfer the mask into the symbolic mask register
    always @(posedge clk or negedge resetn)
        if (!resetn)
            symb_mask <= {(w-1){1'b0}};
        else if ((addr == addr_symb) && (wr_data == data_symb) &&
write && !mask_set)
            symb_mask <= masked_data;
    // -- If the symbolic mask has been set, set this register to stop
it from being overwritten
    always @(posedge clk or negedge resetn)
        if (!resetn)
            mask_set <= 1'b0;
        else if ((addr == addr_symb) && (wr_data == data_symb) &&
write)
            mask_set <= 1'b1;
            else if (mask_set && symb_read_req)
                mask_set <= 1'b0;
```

Once the symbolic mask register 418 has been set the method 500 ends.

Figure 6:
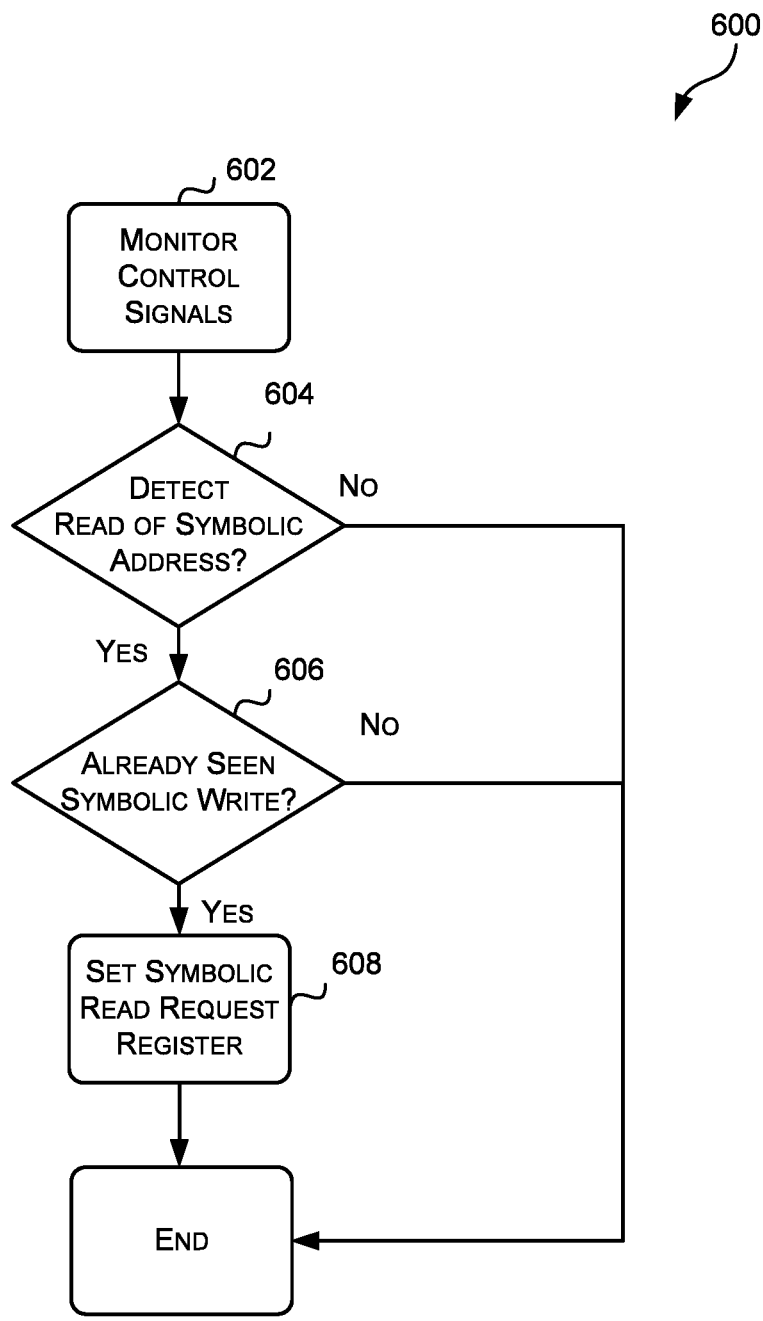
FIG. 6 is a flow diagram of an example method for detecting a symbolic read of an instantiation of a memory unit using the hardware monitor of FIG. 4.

Reference is now made to FIG. 6 which illustrates an example method 600 for detecting a symbolic read in an instantiation of the memory unit which may be implemented by the symbolic read detection logic 404 each cycle. The method 600 begins at block 602 where the symbolic read detection logic 404 monitors one or more control signals of an instantiation of the memory unit. In some cases monitoring the one or more control signals may comprise sampling the relevant control signals. As described above, the relevant control signals for identifying or detecting a symbolic read may be determined based on the type of memory unit being verified and/or the configuration thereof. Example control signals which may be monitored to detect a symbolic read include, but are not limited to, a chip enable signal (c_en), a read enable signal (rd_en), an address signal (addr) and a read address signal (rd_addr). The method 600 then proceeds to block 604.

At block 604, the symbolic read detection logic 404 determines whether the one or more control signals indicate a read of the symbolic address. In some cases determining whether the one or more control signals indicate a read of the symbolic address comprises determining if the one or more control signals indicate a read; and determining if the read address matches the symbolic address. The specific control signals and the status thereof that may be used to indicate a read may be based on the type of memory unit being verified and/or the configuration thereof.

For example, if the memory unit being verified is, for example, a single port RAM that uses a chip enable signal (c_en) to enable reads and writes, a write enable signal (wr_en) to indicate a write to the RAM, and an address signal (addr) to specify the read address or the write address, the symbolic read detection logic 404 may be configured by the configuration API 108 to detect a read when the chip enable signal (c_en) is low and the write enable signal (wr_en) is high; and to detect a read to the symbolic address when a read is detected and the address specified by the address signal (addr) matches the symbolic address.

In another example, if the memory unit being verified is an example dual port RAM that uses a write enable signal (wr_en) to indicate a write to the RAM, a read enable signal (rd_en) to indicate a read of the RAM, a write address signal (wr_addr) to specify the write address, and a read address signal (rd_addr) to specify the read address; the symbolic read detection logic 404 may be configured by the configuration API 108 to detect a read when the read enable signal (rd_en) is low; and to detect a read of the symbolic address when a read is detected and the address specified by the read address signal (rd_addr) matches the symbolic address.

It will be evident to a person of skill in the art that these are examples only and that other controls signals and/or combinations thereof may be used to detect a read of the symbolic address.

If the symbolic read detection logic 404 does not detect a read of the symbolic address the method 600 ends. If, however, the symbolic read detection logic 404 detects a read of the symbolic address the method 600 proceeds to block 606.

At block 606, the symbolic read detection logic 404 determines whether a symbolic write has already been detected. In some cases the symbolic read detection logic 404 determines whether a symbolic write has already been detected based on the status of the seen symbolic write register 410. For example, the symbolic read detection logic 404 may determine that a symbolic write has already been detected if the seen symbolic write register 410 is set. If the symbolic read detection logic 404 determines a symbolic write has not already been detected then the method 600 ends. If, however, the symbolic read detection logic 404 determines that a symbolic write has already been detected then the method 600 proceeds to block 608.

At block 608, the symbolic read detection logic 404 sets the symbolic read request register 412 to indicate that a symbolic read has been detected. The method 600 then ends.

Figure 7:
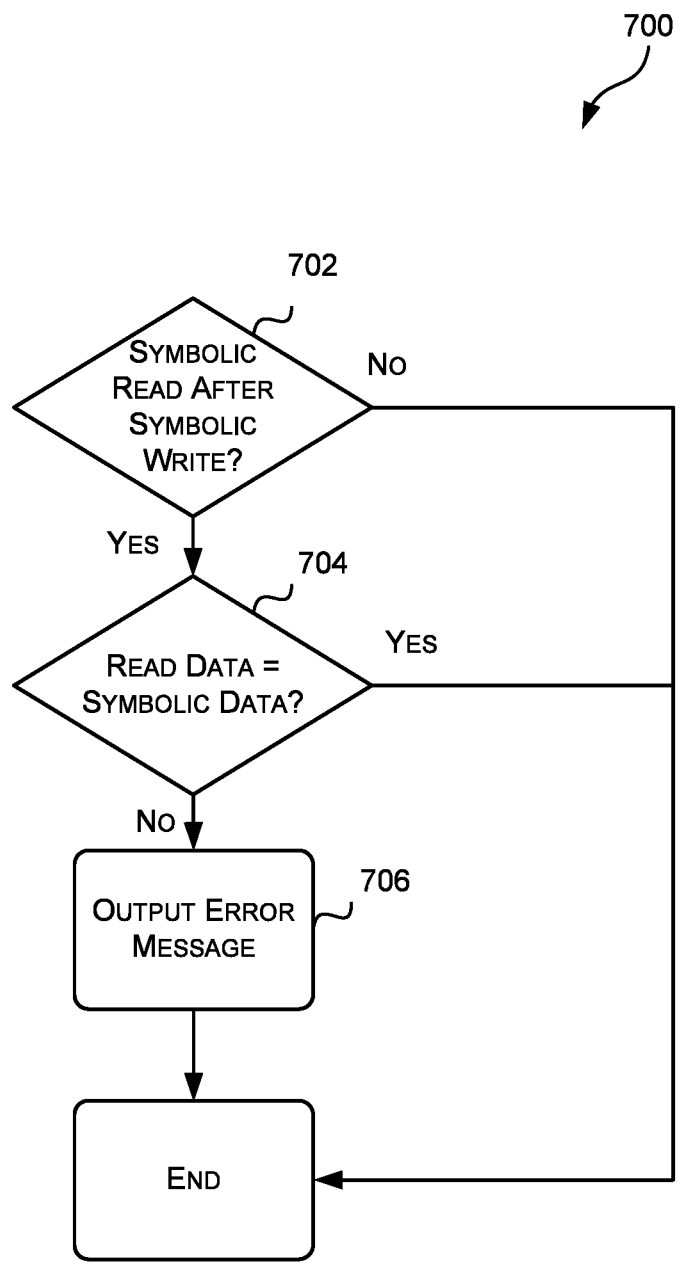
FIG. 7 is a flow diagram of an example method for verifying the operation of an instantiation of a memory unit using an assertion using the hardware monitor of FIG. 4.

Reference is now made to FIG. 7 which illustrates an example method 700 for verifying an assertion that the read data for a symbolic read that follows a symbolic write matches the symbolic data, which may be implemented by the assertion verification logic 408 each cycle. The method 700 begins at block 702 where the assertion verification logic 408 determines whether a symbolic read has occurred after a symbolic write. The assertion verification logic 408 may determine that a symbolic read has occurred after a symbolic write if the seen symbolic write register 410 is set, the symbolic read request register 412 is set and the overwrite register 416 is not set (indicating the symbolic write has not been overwritten). If the assertion verification logic 408 determines that a symbolic read has not occurred after a symbolic write then the method 700 ends. If, however, the assertion verification logic 408 determines that a symbolic read has occurred after a symbolic write then the method 700 proceeds to block 704.

At block 704, the assertion verification logic 408 determines whether the read data corresponding to the symbolic read matches the symbolic data. In some cases the assertion verification logic 408 may determine whether the read data for the symbolic read matches the symbolic data by comparing the read data signal to the symbolic data. Where the memory unit allows partial reads and writes the assertion verification logic 408 may first combine (e.g. perform an AND operation on) the read data and the symbolic data with the data in the symbolic mask register 418 before comparing the read data and the symbolic data so that only the bits that were written to the symbolic address during the symbolic write are compared to the read data. For example, if the data in the symbolic mask register 410 indicates that the first and second bits of the memory block at the symbolic address were written to during the symbolic write then only the first and second bits of the read data are compared with the first and second bits of the symbolic data.

Where there is a fixed delay between when a read request is issued and when the corresponding read data is output then the assertion verification logic 408 may be configured to wait a certain number of cycles before executing block 704 (e.g. before sampling the read data and comparing it to symbolic data). For example if the memory unit being verified is configured to output read data one cycle after a read request is issued the assertion verification logic 408 may wait one cycle before executing block 706. In other words if in cycle A the assertion verification logic 408 detects a symbolic read after a symbolic write then in cycle A+1 the assertion verification logic 408 may execute block 706.

If the assertion verification logic 408 determines that the read data for the symbolic read matches the symbolic data (i.e. the assertion is true) then the memory unit is operating as expected and the method 700 ends. If however, the assertion verification logic 408 determines that the read data for the symbolic read does not match the symbolic data (i.e. the assertion is not true) then the memory unit is not operating as expected and the method 700 proceeds to block 706 where an error is output.

The assertion verification logic 408 can use a single assertion to implement method 700 to verify instantiations of memory units with varying features. For example, the following is an example SV assertion that may be used by the assertion verification logic 408 where seen_symb_write represents the seen symbolic write register 410, overwrite represents the overwrite register 416, symb_read_req represents the symbolic read request register 412, rd_data is the read data signal, symb_mask represents the symbolic mask register 418, and data_symb represents the symbolic data.

```
assert property (@(posedge clk)
    (seen_symb_write && !overwrite && symb_read_req
    |=>
    (rd_data & symb_mask) == (symb_mask & data_symb));
```

As is evident to a person of skill in the art this example assertion states that when a symbolic write has been detected (seen_symb_write), the data has not been overwritten (!overwrite) and when a symbolic read has been detected (symb_read_req) then in the next cycle (|=>) the read data (rd_data) masked with the symbolic mask (symb_mask) is equal to (or matches) the symbolic data (data_symb) masked with the symbolic mask (symb_mask). If this condition is not met then the instantiation of the memory unit is not operating as expected. It will be evident to a person of skill in the art that this is an example only and other assertions written in other languages and/or which establish a different relationship between monitored states and data may be used instead.

In this example assertion it is presumed that there is a one cycle delay between a read request and the corresponding read data being output. In particular, in the example assertion when a symbolic read has been seen after a symbolic write the assertion checks the read data in the next cycle. It will be evident to a person of skill in the art that this is an example only and the assertion could be modified to check the read data after none or more than one cycle.

Where, however, the delay between a read being issued and the read data being output is variable the hardware monitor may include additional logic to detect when the read data has been output and only check the read data once it has been detected that the read data has been output. For example, where the memory unit being verified is a memory unit where the output of a memory read may sit in a register until it is clocked out the hardware monitor may be configured to use several additional registers to monitor when read data is pending (e.g. in the register) and when it has been output Reference is now made to FIG. 8 which illustrates a block diagram of a second example implementation of a hardware monitor 800 which can be used to verify an instantiation of a memory unit with variable read latency.

Figure 8:
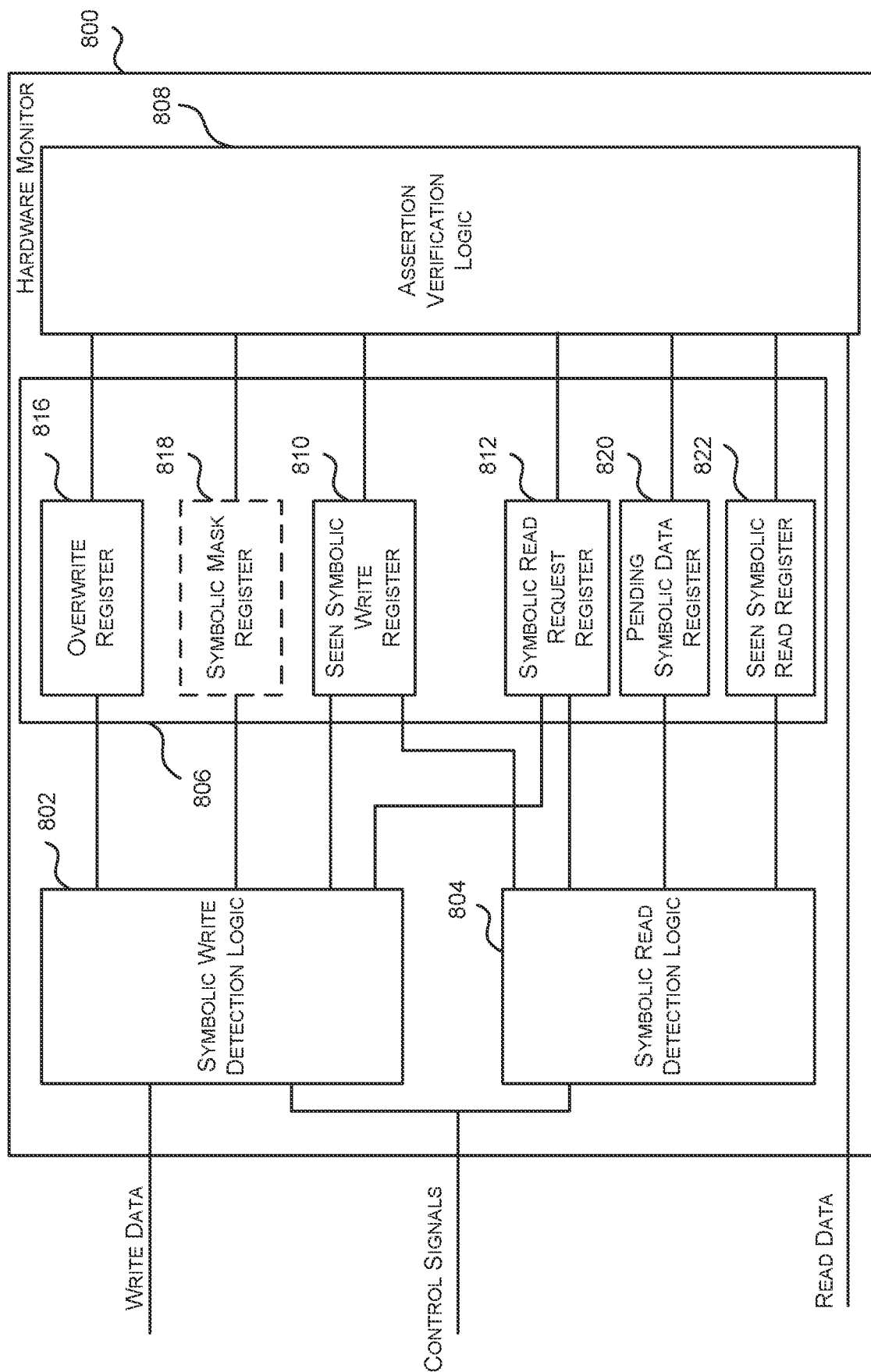
FIG. 8 is a block diagram of a second example implementation of the hardware monitor of FIG. 2 with a second set of registers.

The hardware monitor 800 of FIG. 8 comprises symbolic write detection logic 802, symbolic read detection logic 804, a set of registers 806 and assertion verification logic 808. The set of registers 806 comprises the same registers as the hardware monitor 400 of FIG. 4—namely, a seen symbolic write register 810, a symbolic read request register 812, an overwrite register 816, and an optional symbolic mask register 818—plus two additional registers—a pending symbolic data register 820 for indicating the read data corresponding to the symbolic read is pending, and a seen symbolic read register 822 for indicating that the read data has been output.

The symbolic write detection logic 802 operates in the same manner as the symbolic write detection logic 402 described above with reference to FIG. 4.

The symbolic read detection logic 804, is configured, in addition to setting the symbolic read request register 812 in response to detecting a symbolic read after a symbolic write as described above with reference to FIG. 4, to monitor one or more control signals to determine whether or not the read data for the symbolic read has been output. In particular, the symbolic read detection logic 804 is configured to set the pending symbolic data register 820 when a symbolic read request has been detected, but the data has not yet been output. Once the symbolic read detection logic 804 detects that the read data corresponding to the symbolic write has been output the symbolic read detection logic 804 sets the seen symbolic read register 822.

The following is example SV code which may be implemented by the symbolic read detection logic 804 to set the seen symbolic read register 822 and the pending symbolic data register 820 where a clock gating enable signal is used to enable clocking of the read data. In this example seen_symb_read represents the seen symbolic read register 822, pending_symb_data represents the pending symbolic data register 820, addr represents an address signal, addr_s- ymb represents the symbolic address, read indicates a read was detected, and rd_data_cken represents the clock gate enable signal.

```
// ---------------------------------------------------------------
// -- Seen symbolic read is set after a read request when the
output register
// -- gets clocked
// ---------------------------------------------------------------
    always @(posedge clk or negedge resetn)
        if (!resetn)
            seen_symb_read <= 1'b0;
        else if (symb_read_req && rd_data_cken)
            seen_symb_read <= 1'b1;
// ---------------------------------------------------------------
// -- pending_symb_data is a register which is set
// -- when a read has been issued and not yet clocked out of the
output register
// -- pending_symb is set for the symbolic data
// ---------------------------------------------------------------
    always @(posedge clk or negedge resetn)
        if(!resetn)
            pending_symb_data <= 1'b0;
        else if (((addr == addr_symb) && read) || symb_read_req
&& !rd_data_cken)
            pending_symb_data <= 1'b1;
        else pending_symb_data <= 1'b0;
```

The assertion verification logic 808 verifies an assertion that the read data corresponding to a symbolic read following a symbolic write matches the symbolic data. In this example implementation the assertion verification logic 808 determines that a symbolic read has been made after a symbolic write if the seen symbolic write register 810 and the symbolic read request register 812 are set and the overwrite register 816 is not set. If the assertion verification logic 808 determines that a symbolic read has been made after a symbolic write and the read data has been output (the seen symbolic read register 822 is set) then the assertion verification logic 808 compares the read data to the symbolic data. In particular, the assertion verification logic 808 may compare the read data signal to the symbolic data. In some cases, where the memory unit allows partial reads and writes, the assertion verification logic 808 may be configured to combine (e.g. "AND") each of the read data and the symbolic data with the data in the symbolic mask register 818 before comparing the read data with the symbolic data so only those bits written to by the symbolic write are compared.

The following is an example SV assertion that may be used by the assertion verification logic 808 to verify the operation of an instantiation of a memory unit where read data is clocked out by a clock gate enable signal where symb_read_req represents the symbolic read request register 812, overwrite represents the overwrite register 816, seen_symbolic_write represents the seen symbolic write register 810, pending_symb_data represents the pending symbolic data register 820, rd_data is the read data signal, symb_mask represents the symbolic mask register 818, and data_symb represents the symbolic data:

```
assert property (@ (posedge clk))
    (symb_read_req && !(overwrite && seen_symb_write
    && !pending_symb_data
    |->
    (rd_data & symb_mask) == (symb_mask & data_symb));
```

As is evident to a person of skill in the art this example assertion states that when a symbolic write has been detected (symb_read_req) and corresponding read data output (symb_read_req), the data has not been overwritten (!overwrite), a symbolic write has been detected (seen_symb_write), and the read data is not pending in the pipeline (!pending_symb_data); then the read data (rd_data) masked with the symbolic mask (symb_mask) is equal to (or matches) the symbolic data (data_symb) masked with the symbolic mask (symb_mask). If this condition is not met then the instantiation of the memory unit is not operating as expected. It will be evident to a person of skill in the art that this is an example only and other assertions written in other languages and/or which establish a different relationship between monitored states and data may be used instead.

Figure 9:
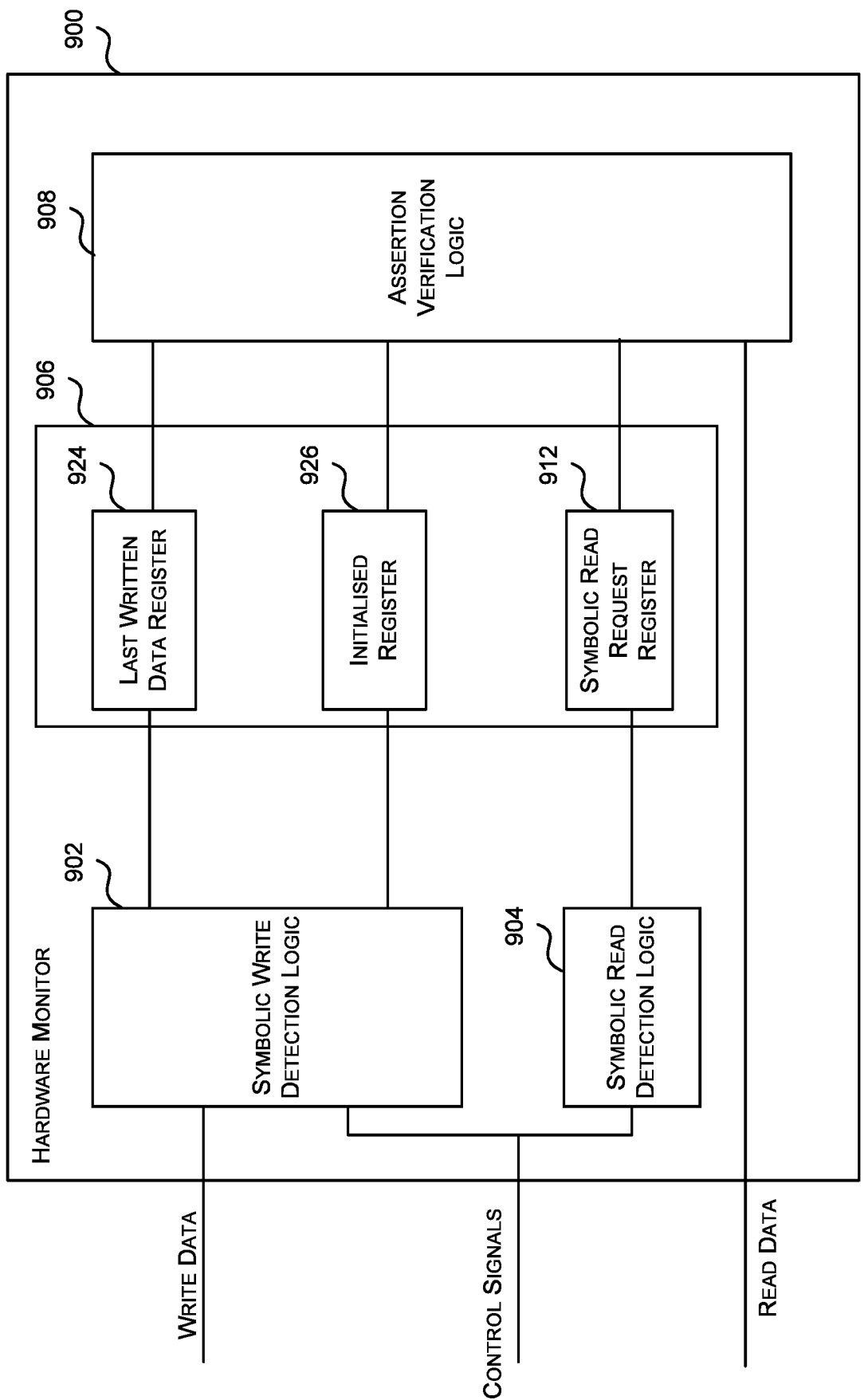
FIG. 9 is a block diagram of a third example implementation of the hardware monitor of FIG. 2 with a third set of registers.

Reference is now made to FIG. 9 which illustrates a block diagram of a third example implementation of a hardware monitor 900 for a verifying a hardware design for a memory unit where a symbolic write is any write to the symbolic address; and an instantiation of the memory unit is considered to be operating as expected if the read data associated with a symbolic read matches data written to the symbolic address by one or more preceding symbolic writes.

The hardware monitor 900 of FIG. 9 comprises symbolic write detection logic 902, symbolic read detection logic 904, a set of registers 906 and assertion verification logic 908. In this implementation the set of registers 906 comprises a symbolic read request register 912 for indicating when a symbolic read has been detected, a last written data register 924 for tracking the data written to the symbolic address, and an initialised register 926 for indicating which bits of the symbolic address have been written to at least once.

The symbolic write detection logic 902 is configured to monitor one or more control signals for writes of any data to the symbolic address. The specific control signals and the status thereof that may be used to detect a write to the symbolic address is based on the specific memory unit being verified and the configuration thereof. If the symbolic write detection logic 902 detects a write of any data to the symbolic address the symbolic write detection logic 902 updates the last written data register 924 to include the data written; and updates the initialised register 926 to indicate which bits of the memory block at the symbolic address have been written to at least once.

Where the memory unit does not allow partial reads and writes then the last written data register 924 is replaced with the write data corresponding to the symbolic write; and the initialised register 926 is updated to indicate that all bits of the memory block at the symbolic address have been written to.

Where, however, the memory unit allows partial reads and writes then the symbolic write detection logic 902 may identify which bits of the memory block were written to during the symbolic write and generate a corresponding mask. For example, if there are four bits in a memory block and the symbolic write writes to bits 0 and 1 then a mask, such as [0 0 1 1] may be generated to indicate that bits zero and one were written to, but that bits two and three were not written to.

The following is example SV code which may be implemented by the symbolic write detection logic 902 for generating the mask where masked_data represents the mask, wr_en[i] represents the $i^{th}$ write enable signal, w is the data width, and p is the partition size:

```
always @(*) begin
    k = 0;
    for (i=0;i<(w/p);i=i+1) begin
        for (j=0;j<p;j=j+1) begin
            masked_data[k] = !wr_en[i];
            k = k + 1;
        end
    end
end
```

The symbolic write detection logic 902 may then combine the mask with the write data signal to identify the data written to the symbolic address and only update the last written data register 924 with that data. For example if the write data is [0 1 0 1] and the mask is [0 0 1 1] then bits one and zero in the last written data register 924 are overwritten with a "0" and "1" respectively and the remaining bits in the last written data register 924 remain the same.

The following is example SV code which may be implemented by the symbolic write detection logic 902 for setting the last written data register 924 where data_in_symb_addr represents the last written data register 924, addr represents an address signal which specifies the write address or the read address, addr_symb represents the symbolic address, mask_data represents the mask described above, and wr_data represents the write data signal:

```
always @(posedge clk or negedge resetn)
    if (!resetn)
        data_in_symb_addr <= {w{1'b0}};
    else if (write && (addr == addr_symb))
        data_in_symb_addr <= ((data_in_symb_addr &
            (~masked_data)) | (wr_data & masked_data));
```

The mask may also be used to update the initialised register 926. For example, the initialised register 926 may be combined with the mask to indicate which bits of the memory block at the symbolic address have been written to at least once. In particular, the initialised register 926 and the mask may be combined (e.g. via an OR function) so that if a particular bit is set in the initialised register 926 or the mask; the initialised register 926 will be updated so that particular bit is set. For example, if the initialised register 926 is set to [0 0 0 1] indicating that only the first bit of the symbolic address location has been written to and the mask is set to [0 0 1 1]; the initialised register 926 will be updated to [0 0 1 1] to indicate that the first two bits have been written to at least once. Any subsequent symbolic write will cause the last written data register 924 and initialised register 926 to be updated with the new data written and any new bits of the memory block written to respectively.

The following is example SV code which may be implemented by the symbolic write detection logic 902 for setting the initialised register 926 where initialised represents the initialised register 916, write indicates whether a write has been detected, addr represents an address signal which specifies a write address or a read address, and masked_data represents the mask described above:

```
always @(posedge clk or negedge resetn)
    if (!resetn)
        initialised <= {w{1'b0)};
    else if (write && addr == addr_symb)
        initialised <= initialised | masked_data;
```

The symbolic read detection logic 904 is configured to monitor one or more control signals to for reads of the symbolic address. The specific control signals and the status thereof which are used to detect a read of the symbolic address are determined by the type of memory unit being verified and the configured thereof. If the symbolic read detection logic 904 detects a read of the symbolic address then the symbolic read detection logic 904 sets the symbolic read request register 912.

The assertion verification logic 908 verifies an assertion that the read data corresponding to a symbolic read following a symbolic write matches the data written to the symbolic address. If the assertion verification logic 908 determines that a symbolic read has been made then the assertion verification logic 908 compares the read data corresponding to the symbolic read to the last data written to the symbolic address. In particular, the assertion verification logic 908 may compare the read data signal combined (e.g. ANDed) with the data in the initialised register 926 to the data in the last written data register 924 combined (e.g. ANDed) with the initialised register 926. For example, if the read data is equal to [0 0 1 1], the last written data register 924 is equal to [1 0 1 1] and the initialised register is equal to [0 0 1 1] then [0 0 1 1] AND [0 0 1 1]=[0 0 1 1] is compared to [1 0 1 1] AND [0 0 1 1]=[0 0 1 1]. If the read data matches the last written data then the memory unit is operating as expected. If, however, the read data does not match the last written data then the instantiation of the memory unit is not operating as expected and an error may be output.

The following is an example SV assertion that may be used by the assertion verification logic 908 wherein symb_read_req represents the symbolic read request register 912, rd_data is the read data signal, initialised represents the initialised register 926, and data_in_symb_addr represents the last written data register 924:

```
assert property (@ (posedge clk))
    ((symb_read_req)
    |=>
    (rd_data & initialised) == (data_in_symb_addr &
        initialised));
```

As is evident to a person of skill in the art this example assertion states that when a symbolic read has been detected (symb_read_req), then in the next cycle (|=>) the read data (rd_data) masked with the initialised register (initialised) is equal to (or matches) the data previously written to the symbolic address (data_in_symb_addr) masked with the initialised register (initialised). If this condition is not met then the instantiation of the memory unit is not operating as expected. It will be evident to a person of skill in the art that this is an example only and other assertions written in other languages and/or which establish a different relationship between monitored states and data may be used instead.

The hardware monitor 900 of FIG. 9 may provide an improvement over the hardware monitor of 400 of FIG. 4 for memory units that implement or allow partial writes. In particular, since the hardware monitor 900 of FIG. 9 compares the complete data value expected at the symbolic address to the read data it allows detection of a write to the symbolic address that erroneously writes more bits than intended.

Although the hardware monitor 900 of FIG. 9 has been described for verifying a hardware design for a memory unit with a fixed delay between a read request being issued and the corresponding read data being output, the modifications described in relation to FIG. 8 for verifying hardware designs for memory units with variable delays between a read request being issued and the corresponding read data being output may also be applied to the hardware monitor 900 of FIG. 9.

Although many of the above examples have been described in reference to verifying the hardware designs for RAMs, it will be evident to a person of skill in the art that the concepts and techniques described herein may be equally applied to verifying hardware designs for CAMs, registers and ROMs. As is known to those of skill in the art, for CAMs the address is determined from the content itself. As a result a CAM can be seen as a hashtable where a lookup is done. As for ROMs, the only difference is that there can only be one write.

The concepts described above in the context of verification of a hardware design for a memory unit, can be used to verify hardware designs for other units of a computing system. In particular, there may be provided a hardware monitor configured to verify a hardware design which defines operation of a unit in a computing system, the hardware monitor comprising: detection logic configured to monitor one or more control signals of an instantiation of the unit to detect indications of the operation of the instantiation of the unit; an assertion verification logic configured to verify the hardware design by verifying an assertion that the detection logic detects indications which are indicative of correct operation of the instantiation of the unit.

Figure 10:
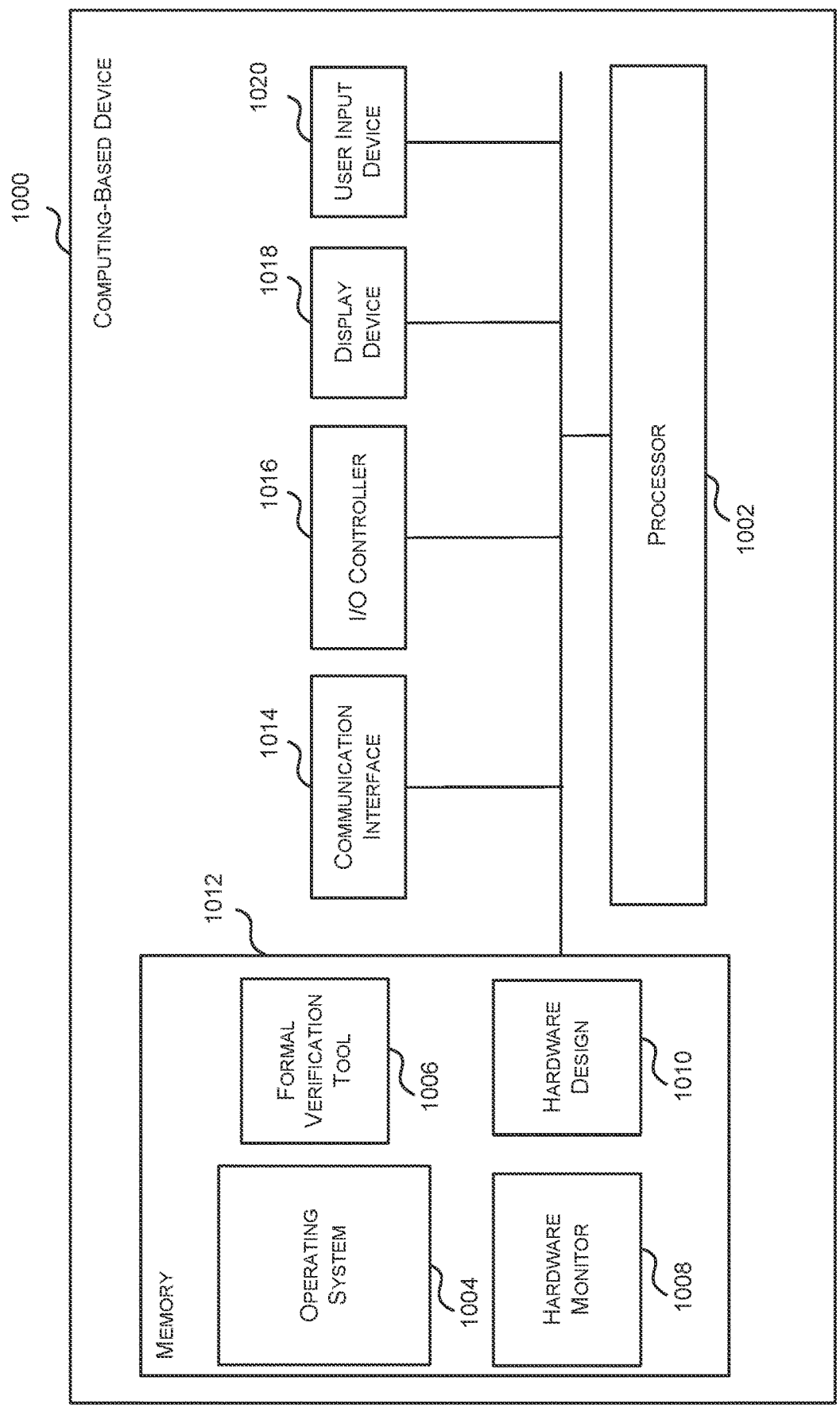
FIG. 10 is a block diagram of an example computing-based device.

FIG. 10 illustrates various components of an exemplary computing-based device 1000 which may be implemented as any form of a computing and/or electronic device, and in which the systems, hardware monitors and methods described above may be implemented.

Computing-based device 1000 comprises one or more processors 1002 which may be microprocessors, controllers or any other suitable type of processors for processing computer executable instructions to control the operation of the device in order to verify the operation of a memory unit in a hardware design. In some examples, for example where a system on a chip architecture is used, the processors 1002 may include one or more fixed function blocks (also referred to as accelerators) which implement a part of the method of verifying a memory unit in a hardware design in hardware (rather than software or firmware). Platform software comprising an operating system 1004 or any other suitable platform software may be provided at the computing-based device to enable application software, such as, but not limited to, the formal verification tool 1006, hardware monitor 1008, and the hardware design 1010 to be executed on the device.

The computer executable instructions may be provided using any computer-readable media that is accessible by computing based device 1000. Computer-readable media may include, for example, computer storage media such as memory 1012 and communications media. Computer storage media (i.e. non-transitory machine readable media), such as memory 1012, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 1012) is shown within the computing-based device 1000 it will be appreciated that the storage may be distributed or located remotely and accessed via a network or other communication link (e.g. using communication interface 1014).

The computing-based device 1000 also comprises an input/output controller 1016 arranged to output display information to a display device 1018 which may be separate from or integral to the computing-based device 1000. The display information may provide a graphical user interface. The input/output controller 1016 is also arranged to receive and process input from one or more devices, such as a user input device 1020 (e.g. a mouse or a keyboard). In an embodiment the display device 1018 may also act as the user input device 1020 if it is a touch sensitive display device. The input/output controller 1016 may also output data to devices other than the display device, e.g. a locally connected printing device (not shown in FIG. 10).

The term 'processor' and 'computer' are used herein to refer to any device, or portion thereof, with processing capability such that it can execute instructions. The term 'processor' may, for example, include central processing units (CPUs), graphics processing units (GPUs or VPUs), physics processing units (PPUs), radio processing units (RPUs), digital signal processors (DSPs), general purpose processors (e.g. a general purpose GPU), microprocessors, any processing unit which is designed to accelerate tasks outside of a CPU, etc. Those skilled in the art will realize that such processing capabilities are incorporated into many different devices and therefore the term 'computer' includes set top boxes, media players, digital radios, PCs, servers, mobile telephones, personal digital assistants and many other devices.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

It is also intended to encompass software which "describes" or defines the configuration of hardware that implements a module, functionality, component, unit or logic (e.g. the components of the hardware monitor and/or memory unit) described above, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed in an integrated circuit manufacturing system configures the system to manufacture a hardware monitor configured to perform any of the methods described herein, or to manufacture a hardware monitor comprising any apparatus described herein. The IC definition dataset may be in the form of computer code, e.g. written in a suitable HDL such as register-transfer level (RTL) code. An example of processing an integrated circuit definition dataset at an integrated circuit manufacturing system so as to configure the system to manufacture a hardware monitor and/or a memory unit will now be described with respect to FIG. 11.

Figure 11:
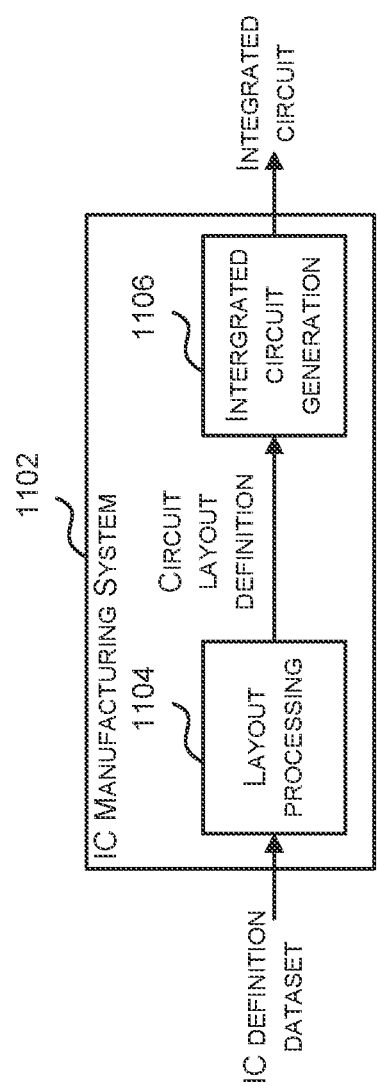
FIG. 11 is a block diagram of an example integrated circuit manufacturing system.

FIG. 11 shows an example of an integrated circuit (IC) manufacturing system 1102 which comprises a layout processing system 1104 and an integrated circuit generation system 1106. The IC manufacturing system 1102 is configured to receive an IC definition dataset (e.g. a hardware design defining a memory unit, or code defining a hardware monitor as described in any of the examples herein), process the IC definition dataset, and generate an IC according to the IC definition dataset (e.g. which embodies a memory unit and/or a hardware monitor in any of the examples herein). The processing of the IC definition dataset configures the IC manufacturing system 1102 to manufacture an integrated circuit embodying a hardware monitor or a memory unit as described in any of the examples herein. More specifically, the layout processing system 1004 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1104 has determined the circuit layout it may output a circuit layout definition to the IC generation system 1106. The IC generation system 1106 generates an IC according to the circuit layout definition, as is known in the art. For example, the IC generation system 1106 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1106 may be in the form of computer-readable code which the IC generation system 1106 can use to form a suitable mask for use in generating an IC. The different processes performed by the IC manufacturing system 1102 may be implemented all in one location, e.g. by one party. Alternatively, the IC manufacturing system 1102 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a hardware monitor or a memory unit (as defined by the hardware design) without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some examples, an integrated circuit definition dataset could include software which runs on hardware defined by the dataset or in combination with hardware defined by the dataset. In the example shown in FIG. 11, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

What is claimed is:

1. A formal verification tool configured to verify operation of an instantiation of a hardware unit for storing data defined in a hardware design, the formal verification tool comprising:
    monitoring logic configured to monitor one or more control signals of the instantiation of the hardware unit to detect writes to a symbolic address of the instantiation of the hardware unit and reads of the symbolic address of the instantiation of the hardware unit, wherein the symbolic address is a variable that represents each possible address value of the instantiation of the hardware unit which causes the formal verification tool to assess each of the possible address values; and
    assertion verification logic configured to verify a formal assertion that establishes that when the monitoring logic detects a read of the symbolic address that occurs after one or more writes to the symbolic address, read data corresponding to the read of the symbolic address matches write data corresponding to the one or more writes to the symbolic address.

2. The formal verification tool of claim 1, further comprising a seen symbolic write register and wherein the monitoring logic is further configured to, in response to detecting a write to the symbolic address, determine if write data corresponding to the write to the symbolic address matches symbolic data, and in response to determining the write data matches the symbolic data, set the seen symbolic write register.

3. The formal verification tool of claim 2, further comprising a symbolic read request register and wherein the monitoring logic is further configured to, in response to detecting a read of the symbolic address when the seen symbolic write register is set, set the symbolic read request register; and
    wherein the assertion verification logic is configured to verify the formal assertion by, in response to determining the seen symbolic write register is set and the symbolic read request register is set, comparing the read data corresponding to the read of the symbolic address to the symbolic data.

4. The formal verification tool of claim 3, wherein the assertion verification logic is further configured to output an error message in response to determining that the read data corresponding to the read of the symbolic address does not match the symbolic data.

5. The formal verification tool of claim 3, further comprising a symbolic mask register, and wherein the monitoring logic is configured to, in response to detecting a write of the symbolic data to the symbolic address, record in the symbolic mask register which particular bits of a memory block were written to; and
    wherein the assertion verification logic is configured to combine each of the read data corresponding to the read of the symbolic address and the symbolic data with the data in the symbolic mask register prior to comparing the read data corresponding to the read of the symbolic address and the symbolic data.

6. The formal verification tool of claim 1, further comprising:
    a symbolic read request register, and wherein the monitoring logic is further configured to, in response to detecting a read of the symbolic address, set the symbolic read request register; and
    a last written data register, and wherein the monitoring logic is further configured to, in response to detecting a write to the symbolic address, store write data corresponding to the write to the symbolic address in the last written data register.

7. The formal verification tool of claim 6, wherein the assertion verification logic is configured to verify the formal assertion by, in response to determining the symbolic read request register is set, comparing the read data corresponding to the read of the symbolic address to the write data in the last written data register.

8. The formal verification tool of claim 7, wherein the assertion verification logic is configured to output an error message in response to determining that the read data corresponding to the read of the symbolic address does not match the write data in the last written data register.

9. The formal verification tool of claim 7, further comprising an initialized register, and wherein the monitoring logic is configured to, in response to detecting a write to the symbolic address, update the initialized register to indicate which particular bits of a memory block at the symbolic address have been written to at least once.

10. The formal verification tool of claim 9, wherein the assertion verification logic is configured to combine each of the read data corresponding to the read of the symbolic address and the write data in the last written data register with the data in the initialized register prior to comparing the read data corresponding to the read of the symbolic address and the write data in the last written data register.

11. The formal verification tool of claim 3, further comprising a seen symbolic read register, and wherein the monitoring logic is further configured to, monitor the one or more control signals to detect that read data corresponding to the read of the symbolic address has been output, and in response to detecting that read data corresponding to the read of the symbolic address has been output, set the seen symbolic read register.

12. The formal verification tool of claim 11, wherein the assertion verification logic is further configured to perform the comparison only if the seen symbolic read register is set.

13. The formal verification tool of claim 1, wherein the hardware unit implements one or more of: multiple access ports, partial reads and writes, pipelining, and clock gating.

14. A test system configured to verify a hardware design for a hardware unit for storing data, the test system comprising:
the formal verification tool as set forth in claim 1; and
a configuration application program interface configured to identify the one or more control signals of the hardware unit to be monitored by the monitoring logic based on a type of the hardware unit, a configuration of the hardware unit or both the type of the hardware unit and the configuration of the hardware unit.

15. A method of verifying operation of an instantiation of a hardware unit for storing data defined by a hardware design, the method comprising:
monitoring, using a formal verification tool, one or more control signals of the instantiation of the hardware unit to detect writes to a symbolic address of the instantiation of the hardware unit, wherein the symbolic address is a variable that represents each possible address value of the instantiation of the hardware unit which causes a formal verification tool to assess each of the possible address values;
monitoring, using the formal verification tool, one or more control signals of the instantiation of the hardware unit to detect reads of the symbolic address of the instantiation of the hardware unit; and
verifying operation of the instantiation of the hardware unit, using the formal verification tool, by verifying a formal assertion that establishes that when a read of the symbolic address occurs after one or more writes to the symbolic address, read data corresponding to the read of the symbolic address matches write data corresponding to the one or more writes to the symbolic address.

16. The method of claim 15, further comprising in response to detecting a write to the symbolic address, storing write data corresponding to the write to the symbolic address in a last written data register; and wherein verifying the formal assertion comprises comparing the read data corresponding to the read of the symbolic address to the write data in the last written data register.

17. The method of claim 16, further comprising, in response to detecting a write to the symbolic address, updating an initialized register to indicate which particular bits of a memory block at the symbolic address have been written to at least once; and wherein verifying the formal assertion further comprises, prior to comparing the read data corresponding to the read of the symbolic address to the write data in the last written data register, combining each of the read data corresponding to the read of the symbolic address and the write data in the last written data register with data in the initialized register.

18. The method of claim 16, further comprising in response to determining that the read data corresponding to the read of the symbolic address does not match the write data in the last written data register, outputting an error message.

19. The method of claim 15, wherein the hardware unit implements one or more of: multiple access ports, partial reads and writes, pipelining and clock gating.

20. A non-transitory computer readable storage medium having stored thereon computer readable instructions, that when executed at a computer system, cause the computer system to perform the steps of the method as set forth in claim 15.

* * * * *